United States Patent [19]

Yamazaki

[11] Patent Number: 4,690,717

[45] Date of Patent: Sep. 1, 1987

[54] METHOD OF MAKING SEMICONDUCTOR DEVICE

[75] Inventor: Shumpei Yamazaki, Tokyo, Japan

[73] Assignee: Semiconductor Energy Laboratory Co., Ltd., Japan

[21] Appl. No.: 800,694

[22] Filed: Nov. 22, 1985

Related U.S. Application Data

[62] Division of Ser. No. 525,459, Aug. 22, 1983, Pat. No. 4,591,892.

[30] Foreign Application Priority Data

Aug. 24, 1982 [JP] Japan ................................ 57-146561
Oct. 18, 1982 [JP] Japan ................................ 57-182546

[51] Int. Cl.$^4$ .......................................... H01L 21/205
[52] U.S. Cl. .......................................... 437/2; 427/39; 427/74; 437/81
[58] Field of Search .................... 29/572; 427/74, 86, 427/87, 39; 136/258 AM; 357/59 C; 148/174

[56] References Cited

U.S. PATENT DOCUMENTS 4,459,163  7/1984  MacDiarmid et al. ............. 148/174

OTHER PUBLICATIONS

A. E. Delahoy et al., *Conf. Record, 15th IEEE Photovoltare Specialists Conf.* (1981), pp. 704–712.

*Primary Examiner*—Aaron Weisstuch
*Attorney, Agent, or Firm*—Gerald J. Ferguson, Jr.; Michael P. Hoffman; Ronni S. Malamud

[57] ABSTRACT

A semiconductor photoelectric conversion device has a conductive substrate or a first conductive layer formed on a suitable substrate, a non-single-crystal semiconductor laminate member formed on the conductive substrate or first conductive layer, including at least one I-type non-single-crystal semiconductor layer and having formed therein at least one PI, NI, PIN, or NIP junction, and a second conductive layer formed on the non-single-crystal semiconductor laminate member. The I-type non-single-crystal semiconductor layer of the non-single-crystal semiconductor laminate member contains oxygen, carbon, or phosphorus only in such a low concentration as $5 \times 10^{18}$ atoms/cm$^3$ or less, $4 \times 10^{18}$ atoms/cm$^3$ or less, or $5 \times 10^{15}$ atoms/cm$^3$ or less, respectively.

6 Claims, 10 Drawing Figures

METHOD OF MAKING SEMICONDUCTOR DEVICE

This is a divisional application Ser. No. 525,459, filed Aug. 22, 1983, now U.S. Pat. No. 4,591,892.

BACKGROUND OF THE INVENTION

1. Field of the Invention

The present invention relates to improvement in or relating to a semiconductor photoelectric conversion device which has a conductive substrate or a first conductive layer formed on a suitable substrate, a non-single-crystal semiconductor laminate member formed on the conductive substrate or the first conductive layer, including at least one I-type non-single-crystal semiconductor layer and having formed therein at least one PI, NI, PIN, or NIP junction, and a second conductive layer formed on the non-single-crystal semiconductor laminate member.

2. Description of the Prior Art

Heretofore there have been proposed a variety of semiconductor photoelectric conversion devices of the type that has a conductive substrate or a first conductive layer fomred on a suitable substrate, a non-single-crystal semiconductor laminate member formed on the conductive substrate or the first conductive layer, including at least one I-type non-single-crystal semiconductor layer and having formed therein at least one PI, NI, PIN OR NIP junction, and a second conductive layer formed on the non-single-crystal semiconductor laminate member.

In the semiconductor photoelectric conversion device of such a structure, the I-type non-single-crystal semiconductor layer has the function of generating photo carriers corresponding to the incidence thereon of light. The I-type non-single-crystal semiconductor layer contains hydrogen or a halogen as a recombination center neutralizer, by which recombination centers are neutralized which would otherwise exist in large quantities since the I-type non-single-crystal semiconductor layer is formed of a non-single-crystal semiconductor. This prevents photo carriers created in the I-type non-single-crystal semiconductor layer from being lost by recombination.

The conventional semiconductor photoelectric conversion devices of this kind have a low photoelectric conversion efficiency of 8% or less.

As a result of various experiments, the present inventor has found that one of the reasons for such a low photoelectric conversion efficiency of the conventional photoelectric conversion devices is that when the I-type non-single-crystal semiconductor layer of the non-single-crystal semiconductor laminate member having the function of creating photo carriers is unavoidably formed to contain oxygen as an impurity, the oxygen content is as high as $10^{20}$ atoms/cm$^3$ or more.

Further, the present inventor has found that another reason for such a low photoelectric conversion efficiency is that when the I-type non-single-crystal semiconductor layer is unavoidably formed to contain carbon as an impurity, the carbon content is as high as $10^{20}$ atoms/cm$^3$ or more.

Besides, the present inventor has found that another reason for such a low photoelectric conversion efficiency is that when the I-type non-single-crystal semiconductor layer is formed to contain phosphorus, the phosphorus content as an impurity is as high as $5 \times 10^{16}$ atoms/cm$^3$ or more.

Moreover, the present inventor has found that when the oxygen content in the I-type non-single-crystal semiconductor layer is as high as $10^{20}$ atoms/cm$^3$ or more, the semiconductor photoelectric conversion device provides a low photoelectric conversion efficiency of 8% or less for the following reason:

In the case where the I-type non-single-crystal semiconductor layer contains oxygen in as high a concentration as $10^{20}$ atoms/cm$^3$ or more, a large number of clusters of oxygen are formed in the I-type non-single-crystal semiconductor layer and these clusters of oxygen serve as recombination centers of photo carriers.

Accordingly, when the oxygen content is as high as mentioned above, the I-type non-single-crystal semiconductor layer contains a number of recombination centers of photo carriers which are not neutralized by a recombination center neutralizer. Consequently, photo carriers which are generated by the incidence of light in the I-type non-single-crystal semiconductor layer are recombined at the recombination centers, resulting in a great loss of the photo carriers.

Further, the I-type non-single-crystal semiconductor layer, when containing oxygen, generates dangling bonds of oxygen, which serve as donor centers. In the case where the I-type non-single-crystal semiconductor layer contains oxygen in such a high concentration as $10^{20}$ atoms/cm$^3$ or more, it contains many dangling bonds of oxygen acting as donor centers. In this case, the midpoint level of the energy band in the I-type non-single-crystal semiconductor layer relatively shifts more towards the valence band than does the Fermi level. Accordingly, the efficiency of photo carriers generation based on the amount of light incident the I-type non-single-crystal semiconductor layer is very low. Further, the diffusion length of holes of the photo carriers in the I-type non-single-crystal semiconductor layer is short. This leads to low photoconductivity and very high dark conductivity of the I-type non-single-crystal semiconductor layer.

Moreover, when the I-type non-single-crystal semiconductor layer contains oxygen, the oxygen is combined with the material forming the layer. For instance, when the layer is formed of silicon, it has a combination with oxygen expressed as Si-O-Si. Accordingly, when the oxygen content is as high as $10^{20}$ atoms/cm$^3$ or more, the layer contains a large amount the combination of the material forming the layer and oxygen.

On the other hand, the combination of the material forming the I-type non-single-crystal semiconductor layer and the oxygen contained therein is decomposed by the irradiation of light to create in the layer dangling bonds of the material forming it and dangling bonds of the oxygen.

Accordingly, in the case where the I-type non-single-crystal semiconductor layer contains oxygen in such a high concentration as $10^{20}$ atoms/cm$^3$ or more, the dangling bonds of the material forming the layer and the dangling bonds of oxygen, which are generated in the layer, greatly increase by the irradiation of light. In such as case, the dangling bonds of the material forming the layer act as recombination centers of the photo carriers, and the loss of photo carriers generated in the layer increases. When the number of dangling bonds of oxygen increases, the midpoint level of the energy band, which has shifted much further towards the valence band than the Fermi level, shifts further towards the valence band correspondingly, resulting in marked reduction of the photo carrier generating efficiency of the I-type non-single-crystal semiconductor layer. Also the diffusion length of holes in the I-type non-single-crystal semiconductor layer is further reduced, markedly lowering the photoconductivity and raising the dark conductivity of the layer.

When the photocarrier generating efficiency and the photoconductivity of the I-type non-single-crystal semiconductor layer have thus been lowered and the loss of the photo carriers in the layer and the dark conductivity of the layer have thus been increased, if the layer is heated, the dangling bonds of the material forming the layer and the dangling bonds of oxygen, generated in large quantities in the layer, are partly recombined with each other to re-form the combination of the material forming the layer and oxygen. As a result, the number of dangling bonds of the material forming the layer and the amount of oxygen decreases. In the I-type non-single-crystal semiconductor layer, however, the dangling bonds of the material forming the layer and the dangling bonds of oxygen still remain in large quantities. Consequently, the photo carrier generating efficiency and the photoconductivity of the I-type non-single-crystal semiconductor layer are very low and result a loss of photo carriers in the layer, and the dark conductivity of the layer is extremely high. In addition, the values of the photo carrier generating efficiency, the photoconductivity, the loss of photo carriers and the dark conductivity of the I-type non-single-crystal semiconductor layer differ significantly before and after irradiation by light and after heating.

The above is the reason found by the present inventor why the photoelectric conversion efficiency of the conventional semiconductor photoelectric conversion device is as low as 8% or less when the I-type non-single-crystal semiconductor layer contains oxygen in such a high concentration as $10^{20}$ atoms/cm$^3$ or more.

Further, the present inventor has found that when the I-type non-single-crystal semiconductor layer contains carbon in such a high concentration as $10^{20}$ atoms/cm$^3$ or more, the photoelectric conversion efficiency of the conventional semiconductor photoelectric conversion device is as low as 8% or less for the following reason:

When the I-type non-single-crystal semiconductor layer contains carbon in such a high concentration as $10^{20}$ atoms/cm$^3$ as referred to previously, the layer forms therein a number of clusters of carbon. The clusters of carbon act as combination centers of photo carriers as is the case with the clusters of oxygen. Accordingly, when the I-type non-single-crystal semiconductor layer contains carbon in such a high concentration as $10^{20}$ atoms/cm$^3$ or more, a great loss of the carriers that are created in the layer due to incidence thereon of light results.

The above is the reason found by the present inventor why the photoelectric conversion efficiency of the conventional semiconductor photoelectric conversion device is 8% or less when the I-type non-single-crystal semiconductor layer contains carbon in such a high concentration as $10^{20}$ atoms/cm$^3$ or more.

Moreover, the present invention has found that when the I-type non-single-crystal semiconductor layer contains phosphorus in such a high concentration as $5 \times 10^{16}$ atoms/cm$^3$ or more, the photoelectric conversion efficiency of the conventional semiconductor photoelectric conversion device is as low as 8% or less for the following reason:

In the case where the phosphorus content in the I-type non-single-crystal semiconductor layer is as high as $5 \times 10^{16}$ atoms/cm$^3$ or more, the midpoint level of the energy band in the I-type layer shifts more towards the valence band than the Fermi level does, as in the case of the layer containing oxygen in such a high concentration as $10^{20}$ atoms/cm$^3$ or more. Accordingly, the photocarrier generating efficiency of the I-type non-single-crystal semiconductor layer is very low. Further, the diffusion length of holes of the photo carriers generated in the layer is short, and hence the photoconductivity of the layer is low and its dark conductivity is very high.

The above is the reason found by the present inventor why the photoelectric conversion efficiency of the conventional semiconductor photoelectric conversion device is as low as 8% or less when the phosphorus content is higher than $5 \times 10^{16}$ atoms/cm$^3$.

SUMMARY OF THE INVENTION

It is therefore an object of the present invention to provide a novel semiconductor photoelectric conversion device which is provided with a conductive substrate or a first conductive layer formed on a suitable substrate, a non-single-crystal semiconductor laminate member formed on the conductive substrate or the first conductive layer, including at least one I-type non-single-crystal semiconductor layer and having formed therein at least one PI, NI, PIN, or NIP junction, and a second conductive layer formed on the non-single-crystal semiconductor laminate member and which is much higher in photoelectric conversion efficiency than conventional semiconductor photoelectric conversion devices of the abovesaid construction.

In accordance with an aspect of the present invention, even if the I-type non-single-crystal semiconductor layer of the non-single-crystal semiconductor laminate member which has the function of generating photo carriers is unavoidably formed to contain oxygen as an impurity, the oxygen content is low, $5 \times 10^{18}$ atoms/cm$^3$ or less.

In accordance with another aspect of the present invention, even if the I-type non-single-crystal semiconductor layer of the non-single-crystal semiconductor laminate member is unavoidably formed to contain carbon as an impurity, the carbon content is low, $4 \times 10^{18}$ atoms/cm$^3$ or less.

In accordance with another aspect of the present invention, even if the I-type non-single-crystal semiconductor layer of the non-single-crystal semiconductor laminate member is unavoidably formed to contain phorphorus as an impurity, the phosphorus content is low, $5 \times 10^{15}$ atoms/cm$^3$ or less.

Therefore, the semiconductor photoelectric conversion device of the present invention has a far higher photoelectric conversion efficiency than the conventional semiconductor photoelectric conversion devices of this kind.

The reason why the photoelectric conversion efficiency when the oxygen content is $5 \times 10^{18}$ atoms/cm$^3$ or less is much higher than the photoelectric conversion efficiency than when the oxygen content is $10^{20}$ atoms/cm$^3$ or more as described previously in connection with the prior art, is the following:

When the oxygen content of the I-type non-single-crystal semiconductor layer is $5 \times 10^{18}$ atoms/cm$^3$ or less, there is formed in the layer few if any clusters of oxygen which act as recombination centers of photo carriers. Accordingly, the I-type non-single-crystal semiconductor layer has few if any recombination centers of photo carriers based on oxygen. Consequently, little if any loss of photo carriers that are created in the I-type non-single-crystal semiconductor layer occurs.

When the oxygen content of the I-type non-single-crystal semiconductor layer is $5 \times 10^{18}$ atoms/cm$^3$ or less, the number of dangling bonds of oxygen contained in the layer is very small. Accordingly, the midpoint level of the energy band of the I-type non-single-crystal semiconductor layer hardly shifts from the Fermi level and even if it does shift, the amount of deviation is very small. Consequently, the photo carrier generating efficiency and the photoconductivity of the layer are much higher than those obtainable with the conventional semiconductor photoelectric conversion device in which the oxygen content of the I-type non-single-crystal semiconductor layer is $10^{20}$ atoms/cm$^3$ or more, and the dark conductivity of the layer is much lower than in the case of the prior art device.

Further, when the oxygen content of the I-type non-single-crystal semiconductor layer is $5 \times 10^{18}$ atoms/cm$^3$ or less, even if the layer contains combinations of the material forming the layer and the oxygen, the number of such combinations is very small. Accordingly, dangling bonds of the material forming the layer and oxygen are not substantially formed by irradiation or the semiconductor photoelectric conversion device by light and, even if they are formed, their number is very small. Further, even if the device is heated, the dangling bonds of the material forming the layer and the dangling bonds of oxygen do not increase. The photo carrier generating efficiency, the photo conductivity and the dark conductivity of the layer do not substantially differ before and after irradiation by light and after heating.

The above is the reason why when the oxygen content of the I-type non-single-crystal semiconductor layer is $5 \times 10^{18}$ atoms/cm$^3$ or less, the semiconductor photoelectric conversion device of the present invention exhibits a much higher photoelectric conversion efficiency than the conventional semiconductor photoelectric conversion device in which the oxygen content of the I-type non-single-crystal semiconductor layer is $10^{20}$ atoms/cm$^3$ or more.

The reason why the photoelectric conversion efficiency when the carbon content is $4 \times 10^{18}$ atoms/cm$^3$ or less is much higher than the photoelectric conversion efficiency when the carbon content is $10^{20}$ atoms/cm$^3$ or more as described previously with respect to the prior art, is the following:

When the carbon content of the I-type non-single-crystal semiconductor layer is $4 \times 10^{18}$ atoms/cm$^3$ or less, there is formed in the layer few, if any clusters of carbon which act as recombination centers of photo carriers. Accordingly, the I-type non-single-crystal semiconductor layer has few, if any combination centers of photo carriers based on cabon. Consequently, little, if any loss of the photo carriers that are created in the I-type non-single-crystal semiconductor layer occurs.

The above is the reason why when the carbon content of the I-type non-single-crystal semiconductor layer is $4 \times 10^{18}$ or less, the semiconductor photoelectric conversion device of the present invention exhibits a much higher photoelectric conversion efficiency than does the conventional semiconductor photoelectric conversion device in which the carbon content of the I-type non-single-crystal semiconductor layer is $10^{20}$ atoms/cm$^3$ or more.

The reason why the photoelectric conversion efficiency when the phosphorous content is $5 \times 10^{15}$ atoms/cm$^3$ or less is much higher than the photoelectric conversion efficiency when the phosphorus content is $5 \times 10^{16}$ atoms/cm$^3$ or more as referred to previously with respect to the prior art, is the following:

When the phosphorus content of the I-type non-single-crystal semiconductor layer is $5 \times 10^{15}$ atoms/cm$^3$ or less, even if the layer contains dangling bonds of phosphorus, their number is very small. Accordingly, the midpoint level of the energy band of the I-type non-single-crystal semiconductor layer scarcely shifts from the Fermi level and even if it does shift, the amount of deviation is very small. Consequently, the photo carrier generating efficiency and the photoconductivity of the layer are much higher than those obtainable with the conventional semiconductor photoelectric conversion device in which the phosphorus content of the I-type non-single-crystal semiconductor layer is $5 \times 10^{16}$ atoms/cm$^3$ or more, and the dark conductivity of the layer is much lower than in the case of the prior art device.

The above is the reason why when the phosphorus content of the I-type non-single-crystal semiconductor layer is $5 \times 10^{15}$ atoms/cm$^3$ or less, the semiconductor photoelectric conversion device of the present invention exhibits a much higher photoelectric conversion efficiency than does the conventional semiconductor photoelectric conversion device in which the phosphorus content of the I-type non-single-crystal semiconductor layer is $5 \times 10^{16}$ atoms/cm$^3$ or more.

Other objects, features and advantages of the present invention will become more fully apparent from the following detailed description taken in conjunction with the accompanying drawings.

DESCRIPTION OF THE PREFERRED EMBODIMENTS

Figure 1:
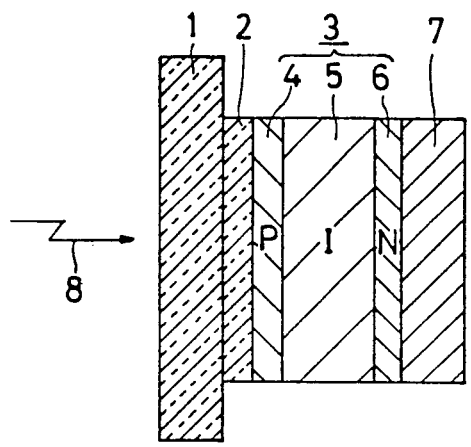
FIGS. 1 and 2 are schematic cross-sectional views respectively illustrating first and second embodiments of a semiconductor photoelectric conversion device to which the present invention is applicable.
Figure 2:
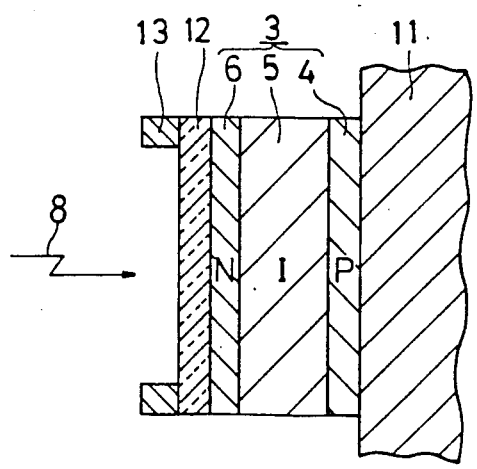

FIGS. 1 and 2 illustrate first and second embodiments of the semiconductor photoelectric conversion device to which the present invention is applicable.

The embodiment of the semiconductor photoelectric conversion device of FIG. 1 to which the present invention is applicable has the following construction:

A light transparent conductive layer 2 such as tin oxide is formed, for example, by vacuum deposition on an insulating and light transparent substrate 1 such as glass.

On the light transparent conductive layer 2 is formed a non-single-crystal semiconductor laminate member 3. The non-single-crystal semiconductor laminate member 3 is formed by a sequential lamination of, for instance, a P-type non-single-crystal semiconductor layer 4, an I-type non-single-crystal semiconductor layer 5 containing hydrogen or a halogen as a recombination center neutralizer, and an N-type non-single-crystal semiconductor layer 6. Accordingly, the non-single-crystal semiconductor laminate member 3 has one I-type non-single-crystal semiconductor layer 5 and has formed therein one PIN junction. In this case, the P-type non-single-crystal semiconductor layer 4 is formed of silicon (Si), $Si_xC_{1-x}$ ($0<x<1$, where $x=0.8$, for instance), germanium (Ge) or the like, and the layer 4 is, for instance, 100 Å thick. When the P-type non-single-crystal semiconductor layer 4 is formed of silicon or $Si_xC_{1-x}$, the I-type non-single-crystal semiconductor layer 5 is formed of silicon or $Si_xGe_{1-x}$, and when the layer 4 is formed of Ge, the layer 5 is formed of Ge. The layer 5 has a thickness of, for example, 0.5 µm. Further, when the I-type non-single-crystal semiconductor layer 5 is formed of silicon or $Si_xGe_{1-x}$, the N-type non-single-crystal semiconductor layer 6 is formed of silicon or $Si_xC_{1-x}$ ($x=0.9$, for example), and when the layer 5 is formed of germanium or $Si_xGe_{1-x}$, the layer 6 is formed of germanium or $Si_xGe_{1-x}$. The N-type non-single crystal semiconductor layer 6 is, for example, 200 Å in thickness.

The non-single-crystal semiconductor layers 4, 5, and 6 making up the non-single-crystal semiconductor laminate member 3 are successively formed by a CVD method which does not employ a glow discharge, or a plasma CVD method which employs a glow discharge.

On the non-single-crystal semiconductor laminate member 3 is formed, for example, by vacuum deposition a reflective conductive layer 7 such as of aluminum.

The above is a description of the structure of the first embodiment of the semiconductor photoelectric conversion device to which the present invention is applicable.

The second embodiment of the semiconductor photoelectric conversion device of FIG. 2 to which the present invention is applicable has the following construction:

On a reflective conductive substrate 11 such as stainless steel is formed the non-single-crystal semiconductor laminate member 3 as is the case with the semiconductor photoelectric conversion device shown in FIG. 1.

The non-single-crystal semiconductor laminate member 3 is formed by a sequential lamination of the P-type non-single-crystal semiconductor layer 4, the I-type non-single-crystal semiconductor layer 5 containing hydrogen or a halogen as a recombination center neutralizer, and the P-type non-single-crystal semiconductor layer 6, as is the case with the non-single-crystal semiconductor laminate member 3 in FIG. 1. Accordingly, the non-single-crystal semiconductor laminate member 3 has one I-type non-single-crystal semiconductor layer 5 and has formed therein one PIN junction, as is the case with the non-single-crystal semiconductor laminate member 3 in FIG. 1. The non-single-crystal semiconductor layers 4, 5, and 6 are also formed by a CVD method such as mentioned above.

On the non-single-crystal semiconductor laminate member 3 is formed, for instance, by vacuum deposition a light transparent conductive layer 12 such as indium oxide containing tin oxide, which corresponds to the conductive layer 2 in FIG. 1.

Further, a conductive layer 13 for external connection use is formed on the conductive layer 12.

The above is a description of the structure of the second embodiment of the semiconductor photoelectric conversion device to which the present invention is applicable.

The first and second embodiments of FIGS. 1 and 2 are essentially identical in construction with known semiconductor photoelectric conversion devices.

With the structure of the semiconductor photoelectric conversion device shown in FIG. 1, when light 8 impinges on the device from outside the substrate 1, it reaches the I-type non-single-crystal semiconductor layer 5 of the non-single-crystal semiconductor laminate member 3 to create therein photo carriers. Accordingly, if a load is connected across the light transparent conductive layer 2 and the reflective conductive layer 7, power is supplied to the load. With the structure of the semiconductor photoelectric conversion device of FIG. 2, the light 8 incident on the light transparent conductive layer 12 reaches the I-type non-single-crystal semiconductor layers 5 of the non-single-crystal semiconductor laminate member 3 to generate therein photocarriers, as is the case of the device shown in FIG. 1. Accordingly, if a load is connected across the reflective conductive substrate 11 and the light transparent conductive layer 12, power is supplied to the load.

When the I-type non-single-crystal semiconductor layer 5 of the non-single-crystal semiconductor laminate member 3 is formed of silicon by the CVD method using, for example, silane ($SiH_4$) gas as a semiconductor raw material gas, it inevitably contains oxygen, carbon, and phosphorus.

The reason for this is that it is extremely difficult to remove oxygen, carbon and phosphorus from the silane gas when it is prepared.

Incidentally, commercially available silane gas of 99.99% purity usually contains oxygen at about 0.1 ppm in the form of a molecular oxygen ($O_2$) and about 3 ppm in the form of water ($H_2O$); carbon at about 5 ppm in the form of methane ($CH_4$) and about 0.1 ppm in the form of ethane ($C_2H_6$), ethylene ($C_2H_4$), propane ($C_3H_8$), and propylene ($C_3H_6$); and phosphorus at about 0.1 ppm in the form of phosphine ($PH_3$).

Further, when the I-type non-single-crystal semiconductor layer 5 of the non-single-crystal semiconductor laminate member 3 is formed of germanium by the CVD method using, for example, germane ($GeH_4$) gas as the semiconductor material gas, the layer 5 inevitably contains oxygen, carbon, and phosphorus because it is extremely difficult in practice to remove them from the germane gas when it is prepared.

Moreover, when the I-type non-single-crystal semiconductor layer 5 of the non-single-crystal semiconductor laminate member 3 is formed of $Si_xGe_{1-x}$ by the CVD method using, as the semiconductor material gas, a mixture of silane and germane gases, the layer 5 inevitably contains oxygen, carbon, and phosphorus because it is extremely difficult, in practice, to prepare the silane and germane gases with substantially no oxygen, carbon, and phosphorus contents.

In the conventional photoelectric device similar to those of FIGS. 1 and 2, the I-type non-single-crystal semiconductor layer 5 of the non-single-crystal semiconductor laminate member 3 contains oxygen in a high concentration exceeding $10^{20}$ atoms/cm$^3$, carbon in a high concentration exceeding $10^{20}$ atoms/cm$^3$, or and/or phosphorus in a high concentration exceeding $5 \times 10^{16}$ atoms/cm$^3$.

In contrast thereto, according to the present invention, even if the I-type non-single-crystal semiconductor layer 5 of the non-single-crystal semiconductor laminate members 3 unavoidably contains oxygen, the oxygen content is only $5 \times 10^{18}$ atoms/cm$^3$ or less.

The I-type non-single-crystal semiconductor layer 5 with such a small oxygen content can be formed by using, as the semiconductor raw material gas in the case of forming the layer of silicon through the CVD method as mentioned above, a silane gas which is obtained by passing a raw silane gas of high purity through a molecular sieve having a mesh diameter of 2.7 to 4.65 Å or a zeolite having a pore diameter of the same size so that the oxygen content of the silane gas may be reduced to substantially zero or a negligibly small amount.

The reason why such a silane gas with essentially no oxygen can be obtained from the raw silane gas by using a molecular sieve or zeolite, is as follows: The effective molecular diameter of the silane is larger than 4.65 Å and when oxygen is contained in the form of $O_2$ and $H_2O$ in the raw silane gas as referred to previously, their molecular diameters are within 2.7 to 4.65 Å, so that the silane cannot pass through the meshes of the molecular sieve or the pores of the zeolite and hence is not adsorbed on the moelcular sieve or zeolite, whereas the oxygen and water contained in the raw silane gas pass through the meshes of the molecular sieve or the pores of the zeolite and are effectively adsorbed thereon.

The oxygen content of such a silane gas can be further reduced by passing it through a deoxidizing agent. By using thus obtained silane gas, the oxygen content of the I-type non-single-crystal semiconductor layer 5 can be further reduced.

Further, according to the present invention, even if the I-type non-single-crystal semiconductor layer 5 of the non-single-crystal semiconductor laminate member 3 unavoidably contains carbon, the carbon content is only $4 \times 10^{18}$ atoms/cm$^3$ or less.

The I-type non-single-crystal semiconductor layer 5 with such a small carbon content can be formed by using, as the semiconductor material gas in the case of forming the layer of silicon through the CVD method as mentioned above, a silane gas which is obtained by passing a raw silane gas of high purity through a molecular sieve having a mesh diameter of 2.7 to 4.65 Å or a zeolite having a pore diameter of the same size so that the carbon content of the silane gas may be reduced to substantially zero or a negligibly small amount.

The reason why such a silane gas with essentially no carbon can be obtained from the raw silane gas through using the molecular sieve or zeolite, is as follows: The effective molecular diameter of the silane is larger than 4.65 Å and when carbon is contained in the form of ethane, ethylene, propane, and propylene in the raw silane gas as referred to previously, their molecular diameters are within 2.7 to 4.65 Å, so that the ethane, ethylene, propane, and propylene contained in the raw silane gas pass through the meshes of the molecular sieve or the pores of the zeolite and are effectively adsorbed thereon.

Further, according to the present invention, even if the I-type non-single-crystal semiconductor layer 5 of the non-single-crystal semiconductor laminate member 3 unavoidably contains phosphorus, the phosphorus content is only $5 \times 10^{15}$ atoms/cm$^3$ or less.

The I-type non-single-crystal semiconductor layer 5 with such a small phosphorus content can be formed by using, as the semiconductor material gas in the case of forming the layer of silicon through the CVD method as mentioned above, a silane gas which is obtained by passing a raw silane gas of high purity through a molecular sieve having a mesh diameter of 4.5 Å or a zeolite having a pore diameter of the same size so that the phosphorus content of the silane gas may be reduced to substantially zero or a negligibly small amount.

The reason why such a silane gas with essentially no phosphorus can be obtained from the raw silane gas through using the molecular sieve or zeolite, is as follows: the effective molecular diameter of the silane is larger than 4.8 Å. and when phosphorus is contained in the form of phosphine in the raw silane gas as referred to previously, its molecular diameter is 4.5 Å, so that the phosphine contained in the raw silane gas passes through the meshes of the molecular sieve or the pores of the zeolite and is effectively adsorbed thereon.

Thus, according to the present invention, the I-type non-single-crystal semiconductor layer 5 contains oxygen in a low concentration such as $5 \times 10^{18}$ atoms/cm$^3$ or less, carbon in a low concentration such as $4 \times 10^{18}$ atoms/cm$^3$ or less and phosphorus in a low concentration such as $5 \times 10^{15}$ atoms/cm$^3$ or less.

Therefore, according to the embodiments of the present invention shown in FIGS. 1 and 2, the photoconductivity of the I-type non-single-crystal semiconductor layer 5 is higher than that of the I-type non-single-crystal semiconductor layer of the conventional photoelectric conversion device which contains oxygen in a high concentration such as $10^{20}$ atoms/cm$^3$ or more, carbon in a high concentration such as $10^{20}$ atoms/cm$^3$ or more and phosphorus in a high concentration such as $5 \times 10^{16}$ atoms/cm$^3$ or more.

Figure 3:
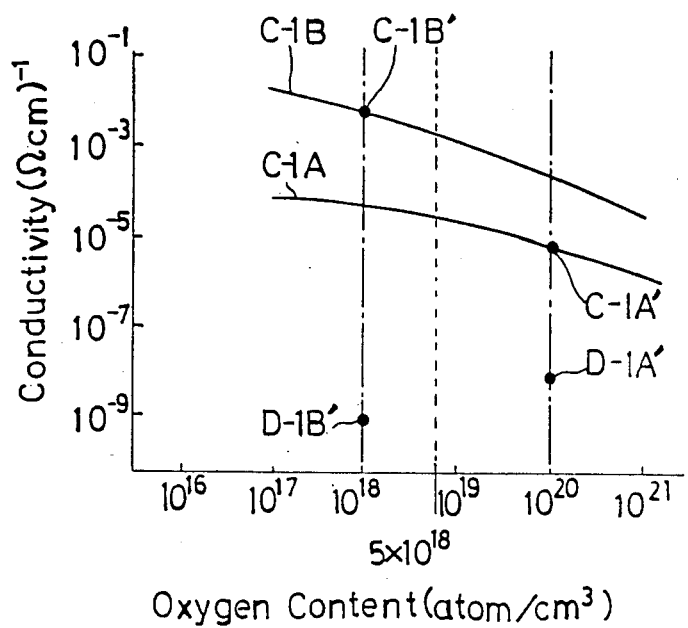
FIG. 3 is a graph showing the relationships of the photoconductivity and dark conductivity of an I-type non-single-crystal semiconductor layer of a non-single-crystal semiconductor laminate member and the oxygen content of the layer in the semiconductor photoelectric conversion devices of FIGS. 1 and 2.
Figure 4:
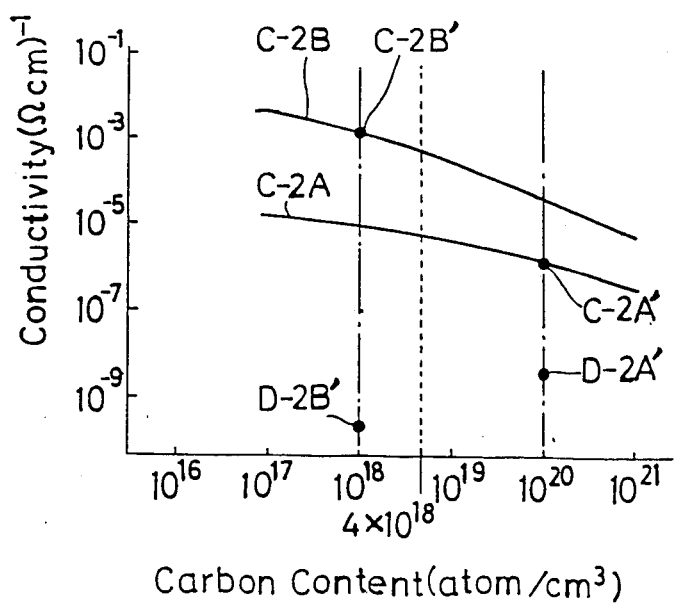
FIG. 4 is a graph showing the relationships of the photoconductivity and dark conductivity of the I-type non-single-crystal semiconductor layer of the non-single-crystal semiconductor laminate member and the carbon content of the layer in the semiconductor photoelectric conversion devices of FIGS. 1 and 2.
Figure 5:
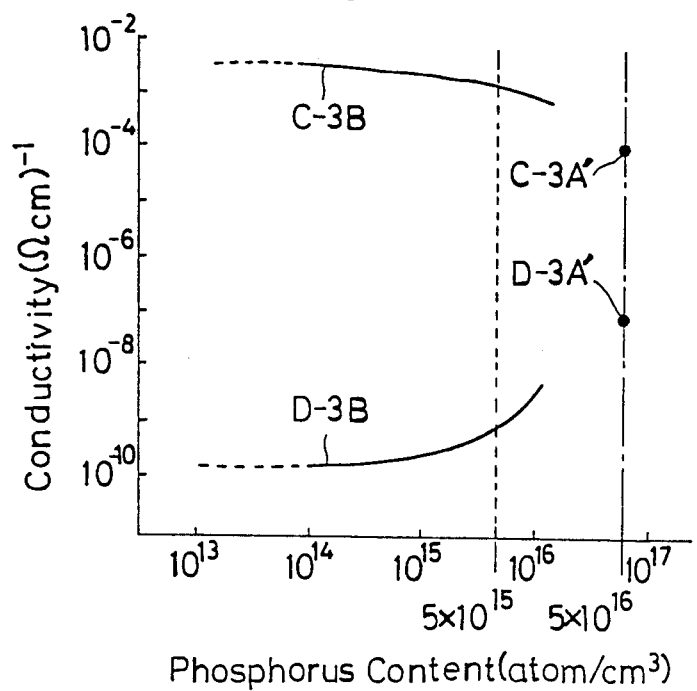
FIG. 5 is a graph showing the relationships of the photoconductivity and dark conductivity of the I-type non-single-crystal semiconductor layer of the non-single-crystal semiconductor laminate and the phosphorus content of the layer in the semiconductor photoelectric conversion devices of FIGS. 1 and 2.

FIGS. 3 to 5 show this.

That is, in the case where the carbon content and the phosphorus content of the I-type non-single-crystal semiconductor layer 5 are $3 \times 10^{20}$ and $5 \times 10^{16}$ atoms/cm$^3$, respectively, the photoconductivity ($\Omega$cm)$^{-1}$ of the layer 5 as a function of the oxygen content (atom/cm$^3$) thereof is as indicated by curve C-1A in FIG. 3. In the case where the carbon content and the phosphorus content of the layer 5 are $4 \times 10^{18}$ and $5 \times 10^{15}$ atoms/cm$^3$, respectively, the photoconductivity of the layer 5 as a function of the oxygen content thereof is as indicated by a curve C-1B in FIG. 3.

In the case where the photoconductivity of the layer 5 is as indicated by point C-1A' on the curve C-1A in FIG. 3, when the layer 5 contains oxygen in the concentration at the point C-1A', the dark conductivity ($\Omega$cm)$^{-1}$ of the layer 5 is as indicated by a point D-1A' in FIG. 3. In the case where the photoconductivity of the layer 5 is as indicated by a point C-1B' on the curve C-1B in FIG. 3, when the layer 5 contains oxygen in the concentration at the point C-1B', the dark conductivity of the layer 5 is as indicated by point D-1B' in FIG. 3.

Further, in the case where the oxygen content and the phosphorus content of the I-type non-single-crystal semiconductor layer 5 are $1 \times 10^{20}$ and $5 \times 10^{16}$ atoms/cm$^3$, respectively, the photoconductivity of the layer 5 as a function of the carbon content thereof is as indicated by curve C-2A in FIG. 4. In the case where the oxygen content and the phosphorus content of the layer 5 are $3 \times 10^{17}$ and $5 \times 10^{15}$ atoms/cm$^3$, respectively, the photoconductivity of the layer 5 as a function of the carbon content thereof is as indicated by curve C-2B in FIG. 4.

In the case where the photoconductivity of the layer 5 is as indicated by point C-2A' on the curve C-2A in FIG. 4, when the layer 5 contains carbon in the concentration at the point C-2A', the dark conductivity of the layer 5 is as indicated by point D-2A' in FIG. 4. In the case where the photoconductivity of the layer 5 is as indicated by a point C-2B' on the curve C-2B in FIG. 4, when the layer 5 contains carbon in the concentration at the point C-2B', the dark conductivity of the layer 5 is as indicated by point D-2B'in FIG. 4.

Moreover, in the case where the oxygen and carbon contents of the I-type non-single-crystal semiconductor layer 5 are both $2 \times 10^{20}$ atoms/cm$^3$, the photoconductivity and the dark conductivity of the layer 5 in the case when its phosphorus content is $5 \times 10^{16}$ atoms/cm$^3$ is as indicated by points C-3A' and D-3A' in FIG. 5, respectively. In the case where the oxygen content and the carbon content of the layer 5 are $5 \times 10^{18}$ and $4 \times 10^{18}$ atoms/cm$^3$, respectively, the photoconductivity and the dark conductivity of the layer 5 as a function of the phosphorus content thereof are as indicated by curves C-3B and D-3B in FIG. 5, respectively.

As will be appreciated from the above, according to the present invention, the I-type non-single-crystal semiconductor layer 5 has a much higher photoconductivity than does the I-type non-single-crystal semiconductor layer of the conventional semiconductor photoelectric conversion device.

Further, according to the present invention, one of the reasons for the high photoconductivity of the I-type non-single-crystal semiconductor layer is that the photoelectric conversion efficiency, the short-circuit current, and the fill factor ((short-circuit current x open voltage)/maximum power) of the semiconductor photoelectric conversion device of the present invention are much higher than those of the conventional semiconductor photoelectric conversion device.

Figure 6:
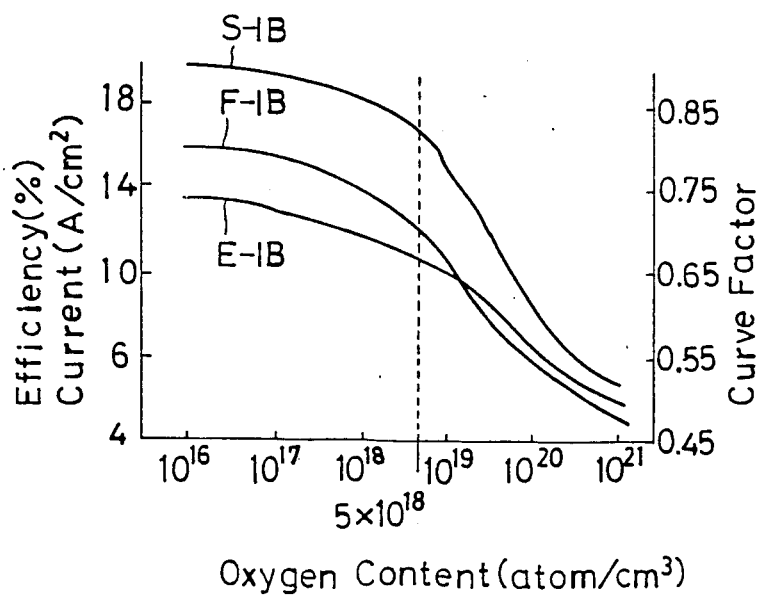
FIG. 6 is a graph showing the relationships of the photoelectric conversion efficiency, short-circuit current, and fill factor of the semiconductor photoelectric conversion devices of FIGS. 1 and 2 to the oxygen content of the I-type non-single-crystal semiconductor layer.
Figure 7:
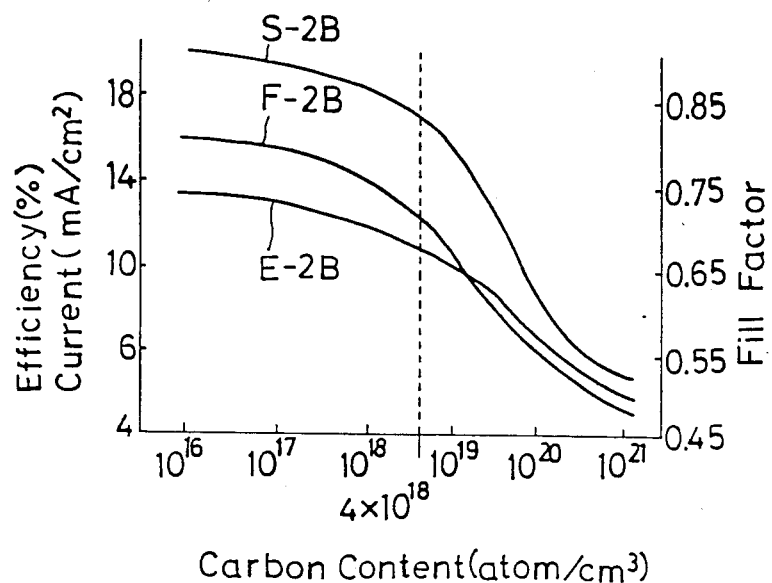
FIG. 7 is a graph showing the relationships of the photoelectric conversion efficiency, short-circuit current, and fill factor of the semiconductor photoelectric conversion devices of FIGS. 1 and 2 to the carbon content of the I-type non-single-crystal semiconductor layer.
Figure 8:
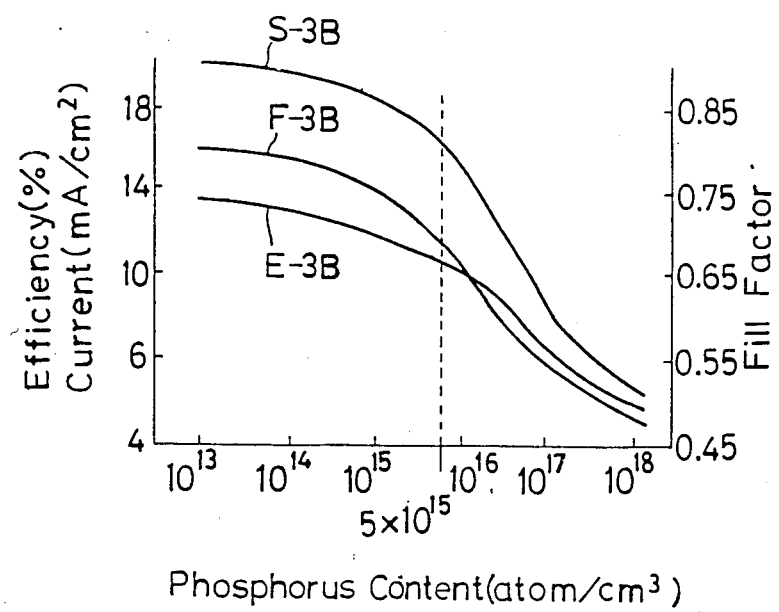
FIG. 8 is a graph showing the relationships of the photoelectric conversion efficiency, short-circuit current, and fill factor of the semiconductor photoelectric conversion devices of FIGS. 1 and 2 to the phosphorus content of the I-type non-single-crystal semiconductor layer.

FIGS. 6 to 8 show this.

That is, when the photoconductivity of the I-type non-single-crystal semiconductor layer 5 is as indicated by the curve C-1B in FIG. 3, the photoelectric conversion efficiency (%), the short-circuit current (mA/cm$^2$), and the fill factor of the semiconductor photoelectric conversion device as a function of the oxygen content (atom/cm$^3$) of the layer 5 are such as indicated by curves E-1B, S-1B, and F-2B, respectively, in FIG. 6.

When the photoconductivity of the I-type non-single-crystal semiconductor layer 5 is as indicated by the curve C-2B in FIG. 4, the photoelectric conversion efficiency, the short-circuit current, and the fill factor relative to the carbon content of the layer 5 are as indicated by curves E-2B, S-2B, and F-2B, respectively, in FIG. 7.

Further, when the photoconductivity of the I-type non-single-crystal semiconductor layer 5 is as indicated by the curve C-3B in FIG. 5, the photoelectric conversion efficiency, the short-circuit current, and the factor of the semiconductor photoelectric conversion device relative to the phosphorus content of the layer 5 are as indicated by E-3B, S-3B and F-3B, respectively, in FIG. 8. In this case, the oxygen and carbon contents of the layer 5 are $10^3$ times the phosphorus content thereof.

Thus, according to the present invention, the photoelectric conversion efficiency, the short-circuit current, and the fill factor of the semiconductor photoelectric conversion device can be made much higher than those obtainable with the prior art semiconductor photoelectric conversion device.

Moreover, according to the semiconductor photoelectric conversion device of the present invention, its photoelectric conversion efficiency is hardly affected by irradiation by light and, even by heating after the light irradiation, the photoelectric conversion efficiency undergoes no appreciable changes.

Figure 9:
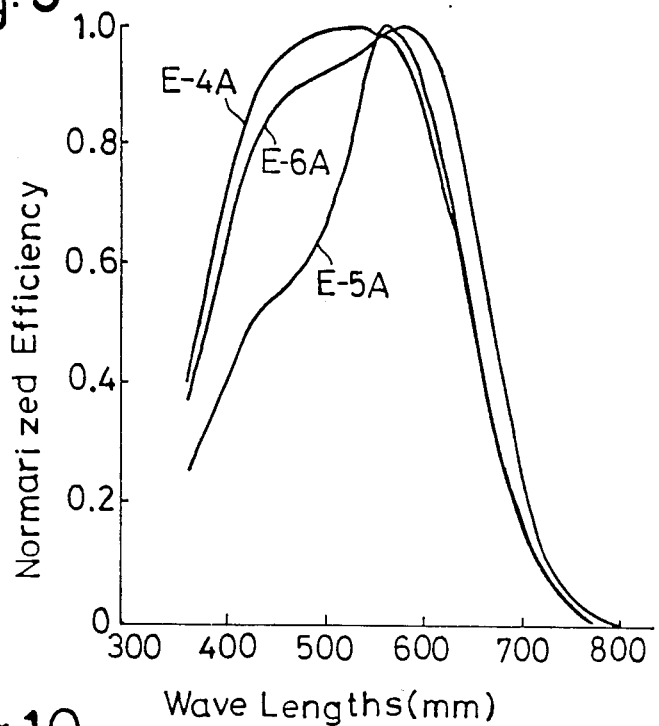
FIGS. 9 and 10 are graphs showing the relationships of the normalized photoelectric conversion efficiency of the semiconductor photoelectric conversion devices of FIGS. 1 and 2 to the wavelengths of light before and after irradiation of the devices by light and after heating.
Figure 10:
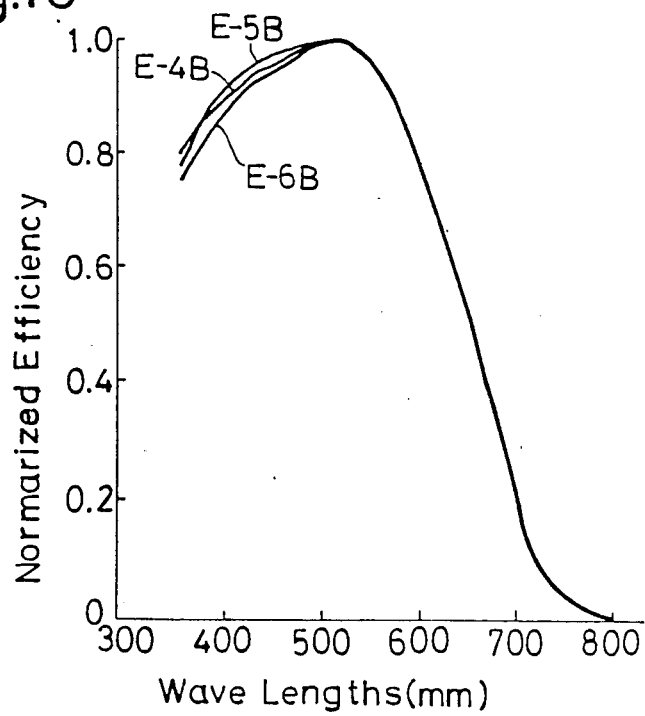

FIGS. 9 and 10 show this.

That is, when the photoconductivity of the I-type non-single-crystal semiconductor layer 5 is obtained as indicated by the point C-1A' in FIG. 3, the photoelectric conversion efficiency (normalized with respect to a maximum photoelectric conversion efficiency of 1) as a function of the wavelength (mm) of incident light is as indicated by curve E-4A in FIG. 9 before irradiation by light and, after the irradiation by light, it becomes as indicated by curve E-5A in FIG. 9 and, by heating at 150° C. for two hours after the irradiation by light, the photoconductivity is as indicated by curve E-6A in FIG. 9.

When the photoconductivity of the I-type non-single-crystal semiconductor layer 5 is as indicated by the point C-1B' in FIG. 3, the photoelectric conversion efficiency (normalized as mentioned above) as a function of the wavelength of incident light is as indicated by curve E-4B in FIG. 10. After irradiation light under the same conditions as in the case of curve E-5A in FIG. 9, the photoelectric conversion efficiency is as indicated by curve E-5B in FIG. 10 and, by heating under the same conditions as mentioned above after the irradiation by light, the photoelectric conversion efficiency becomes as indicated by curve E-6B in FIG. 10.

As will be appreciated from the above, according to the present invention, the photoelectric conversion efficiency hardly changes and it remains substantially unchanged even if heating is carried out after irradiation by light.

While the present invention has been described as being applied to a semiconductor photoelectric conversion device in which the non-single-crystal semiconductor laminate member has a PIN or NIP type structure and, accordingly, it has formed therein one PIN or NIP junction, the present invention is also applicable to semiconductor photoelectric conversion devices in which the non-single-crystal semiconductor laminate member has an NI, PI, NIN, or PIP type structure and, accordingly, it has formed therein at least one NI, PI, NIN, or PIP junction.

Also the present invention is applicable to semiconductor photoelectric conversion devices of the type in which the non-single-crystal semiconductor laminate member has, for example, an NIPIN or PINIP type structure and, accordingly, has formed therein at least one PIN and NIP junction.

It will be apparent that many modifications and variations may be effected without departing from the scope of the novel concepts of the present invention.

What is claimed is:

1. A method of making a semiconductor device, said method comprising:

forming a non-single-crystal semiconductor laminate member on a substrate or a conductive layer, said laminate member including at least one I-type non-single-crystal semiconductor layer and having formed therein at least one PI, NI, PIN, or NIP junction, said I-type layer being formed using a silane gas obtained by passing a raw silane gas of high purity through a passage containing a molecular sieve having a mesh diameter of 2.7 to 4.65 A or zeolite having a pore diameter of the same size;

wherein the I-type non-single-crystal semiconductor layer of the non-single-crystal semiconductor laminate member contains oxygen only in such a low concentration as $5 \times 10^{18}$ atoms/cm$^3$ or less.

2. A method for making a semiconductor device, said method comprising:

forming a non-single-crystal semiconductor laminate member on a substrate or a conductive layer, said laminate member including at least one I-type non-single-crystal semiconductor layer and having formed therein at least one PI, NI, PIN, or NIP junction, said I-type layer being formed using a silane gas obtained by passing a raw silane gas of high purity through a passage containing a molecular sieve having a mesh diameter of 2.7 to 4.65 A or zeolite having a pore diameter of the same size;

wherein the I-type non-single-crystal semiconductor layer of the non-single-crystal semiconductor laminate member contains carbon only in such low concentration as $4 \times 10^{18}$ atoms/cm$^3$ or less.

3. A method of making a semiconductor device, said method comprising:

forming a non-single-crystal semiconductor laminate member on a substrate or a conductive layer, said laminate member including at least one I-type non-single-crystal semiconductor layer and having formed therein at least one PI, NI, PIN, or NIP junction, said I-type layer being formed using a silane gas obtained by passing a raw silane gas of high purity through a passage containing a molecular sieve having a mesh diameter of about 4.5 A or zeolite having a pore diameter of the same size;

wherein the I-type non-single-crystal semiconductor layer of the non-single-crystal semiconductor laminate member contains phosphorus only in such low cencentration as $5 \times 10^{15}$ atoms/cm$^3$ or less.

4. A method according to claim 1, 2 or 3, wherein the I-type non-single-crystal semiconductor layer of the non-single-crystal semiconductor laminate member is formed of silicon, germanium or $Si_xGe_{1-x}(0<x<1)$.

5. A method according to claim 4, wherein the I-type non-single-crystal semiconductor layer of the non-single-crystal semiconductor laminate member contains hydrogen or a halogen as a recombination center neutralizer.

6. A method according to claims 1, 2, or 3, wherein the silane gas is monosilane expressed by SiH$_4$.

* * * * *